US008643367B2

(12) United States Patent
Huang et al.

(10) Patent No.: US 8,643,367 B2
(45) Date of Patent: *Feb. 4, 2014

(54) CRYOGENIC SYSTEM AND METHOD FOR SUPERCONDUCTING MAGNETS AND MRI WITH A FULLY CLOSED-LOOP COOLING PATH

(75) Inventors: Xianrui Huang, Clifton Park, NY (US); Yan Zhao, Shanghai (CN); Tao Zhang, Clifton Park, NY (US); Anbo Wu, Shanghai (CN); Evangelos Trifon Laskaris, Schenectady, NY (US); Paul St. Mark Shadforth Thompson, Stephentown, NY (US)

(73) Assignee: General Electric Company, Schenectady, NY (US)

(*) Notice: Subject to any disclaimer, the term of this patent is extended or adjusted under 35 U.S.C. 154(b) by 522 days.

This patent is subject to a terminal disclaimer.

(21) Appl. No.: 12/912,934

(22) Filed: Oct. 27, 2010

(65) Prior Publication Data
US 2011/0101982 A1 May 5, 2011

(30) Foreign Application Priority Data

Oct. 30, 2009 (CN) .......................... 2009 1 0209705

(51) Int. Cl.
*G01R 33/3815* (2006.01)
*G01R 33/38* (2006.01)
*F25D 19/00* (2006.01)

(52) U.S. Cl.
USPC ............. 324/318; 324/322; 62/51.1; 62/48.2; 62/47.1; 62/63; 62/600

(58) Field of Classification Search
USPC .................. 324/300–322; 382/128–131; 600/407–435; 62/600, 63, 51.1, 48.2, 62/47.1
See application file for complete search history.

(56) References Cited

U.S. PATENT DOCUMENTS

| 3,350,632 | A | * | 10/1967 | Robinson | 324/304 |
|---|---|---|---|---|---|
| 4,277,949 | A | * | 7/1981 | Longsworth | 62/47.1 |
| 5,193,349 | A | * | 3/1993 | Laverman et al. | 62/64 |
| 5,584,184 | A | | 12/1996 | Inaguchi et al. | |
| 5,586,437 | A | * | 12/1996 | Blecher et al. | 62/47.1 |
| 5,828,280 | A | | 10/1998 | Spivey, Jr. et al. | |
| 6,828,889 | B1 | | 12/2004 | Zaput | |

(Continued)

FOREIGN PATENT DOCUMENTS

| JP | 2008151387 A | 7/2008 |
|---|---|---|
| JP | 2008249201 A | 10/2008 |

OTHER PUBLICATIONS

GB Search Report issued in connection with corresponding GB Application No. GB1018025.5 on Feb. 23, 2011.

*Primary Examiner* — Melissa Koval
*Assistant Examiner* — Tiffany Fetzner
(74) *Attorney, Agent, or Firm* — Global Patent Operation; Marc A. Vivenzio

(57) ABSTRACT

A cryogenic system for a superconducting magnet comprises a closed-loop cooling path. The closed-loop cooling path comprises a magnet cooling tube thermally coupled to the superconducting magnet. The magnet cooling tube comprises a cryogen flow passage. The closed-loop cooling tube further comprises a re-condenser is fluidly coupled to the magnet cooling tube through tube sections and a liquid cryogen container fluidly coupled between the magnet cooling tube and the re-condenser. At least one gas tank is fluidly coupled to the magnet cooling tube through a connection tube.

17 Claims, 2 Drawing Sheets

(56) References Cited

U.S. PATENT DOCUMENTS

| | | |
|---|---|---|
| 6,995,562 B2 | 2/2006 | Laskaris et al. |
| 7,185,501 B2 | 3/2007 | Steinbach |
| 7,228,686 B2 | 6/2007 | Royal et al. |
| 7,383,688 B2 * | 6/2008 | van Hasselt ................ 62/51.1 |
| 8,374,663 B2 * | 2/2013 | Laskaris et al. ............ 505/163 |
| 2005/0204751 A1 * | 9/2005 | White et al. ................ 62/51.1 |
| 2005/0229609 A1 * | 10/2005 | Kirichek et al. ................ 62/6 |
| 2006/0236709 A1 | 10/2006 | Steinmeyer |
| 2007/0062203 A1 * | 3/2007 | Hasselt ....................... 62/51.1 |
| 2008/0115510 A1 * | 5/2008 | Crowley et al. ............ 62/51.1 |
| 2010/0016168 A1 * | 1/2010 | Atkins et al. ............... 505/162 |
| 2011/0101982 A1 * | 5/2011 | Huang et al. ............... 324/318 |
| 2011/0179809 A1 * | 7/2011 | Zhang et al. ............... 62/51.1 |
| 2012/0196753 A1 * | 8/2012 | Laskaris et al. ............ 505/163 |

\* cited by examiner

CRYOGENIC SYSTEM AND METHOD FOR SUPERCONDUCTING MAGNETS AND MRI WITH A FULLY CLOSED-LOOP COOLING PATH

BACKGROUND

1. Technical Field

Embodiments of the invention relate to a cryogenic system for superconducting magnets.

2. Discussion of Related Art

Superconducting magnets conduct electricity without resistance as long as magnets are maintained at a suitably low temperature, which is referred to as "superconducting temperature" herein after. Accordingly, cryogenic systems are used to ensure that the superconducting magnets work below the superconducting temperature.

One conventional cryogenic system uses a cooling coldhead which is mounted to the superconducting magnet. Such mounting of the cooling coldhead to the superconducting magnet has several disadvantages including the detrimental effects of stray magnetic fields on the coldhead motor, vibration transmission from the coldhead to the superconducting magnet, and temperature gradients along the thermal connections between the coldhead and the superconducting magnet.

Another conventional cryogenic system uses a large volume of liquid cryogen in a cryogen bath to cool the superconducting magnet. The heat of the superconducting magnet is removed by boiling off the liquid cryogen to gaseous cryogen. In some magnets, the boil off cryogen gas vents to the atmosphere and periodic cryogenic service to refill the cryogen is required. Some magnet uses a refrigerator or a cryocooler to re-condense the boil-off cryogen gas back into liquid. However, when the refrigeration is turned off by loss of electric power or during system maintenance, or when the magnet is quenching and the stored electromagnetic energy of the magnet is dumped into heat, there is a large amount of boil-off cryogen gas that vents to the atmosphere and be lost. Cryogenic service and cryogen refilling are also needed once the refrigeration is turned back on.

It may be desirable to have a different cryogenic system that contains very small volume of cryogen in a completely closed system so that no cryogen would ever differs from those systems that are currently available with minimized gaseous cryogen vented out of the cryogenic system.

BRIEF DESCRIPTION

In accordance with one embodiment, a cryogenic system for a superconducting magnet is provided. The cryogenic system comprises a closed-loop cooling path. The closed-loop cooling path comprises a magnet cooling tube thermally coupled to the superconducting magnet. The magnet cooling tube comprises a cryogen flow passage. The closed-loop cooling tube further comprises a re-condenser is fluidly coupled to the magnet cooling tube through tube sections and a liquid cryogen container fluidly coupled between the magnet cooling tube and the re-condenser. At least one gas tank is fluidly coupled to the magnet cooling tube through a connection tube.

In accordance with another embodiment, a magnetic resonance imaging system is provided. The magnetic resonance imaging system comprises a superconducting magnet defining a central bore, a thermal shield enclosing the superconducting magnet, and a closed-loop cooling path within the thermal shield. The closed-loop cooling tube comprises a magnet cooling tube thermally coupled to the superconducting magnet. The magnet cooling tube comprises a cryogen flow passage. A re-condenser is fluidly coupled to the magnet cooling tube through tube sections and is associated with a refrigerator. A liquid cryogen container is fluidly coupled between the magnet cooling tube and the re-condenser. At least one gas tank is in thermal contacting with the thermal shield, and is fluidly coupled to the magnet cooling tube through a connection tube.

In accordance with still another embodiment, a cryogenic cooling method for a superconducting magnet is provided. The method comprises thermally contacting a magnet cooling tube to the superconducting magnet, flowing a liquid cryogen through at least a portion of the magnet cooling tube, removing heat of the superconducting magnet by vaporization of converting the liquid cryogen into a boil-off gaseous cryogen, contacting the boil-off gaseous cryogen with a re-condenser for converting some of the boil-off gaseous cryogen back into liquid cryogen and filling back the liquid cryogen into the magnet cooling tube; and storing some of the boil-off gaseous cryogen in at least one gas tank which is fluidly coupled to the magnet cooling tube through a connection tube.

BRIEF DESCRIPTION OF THE DRAWING FIGURES

These and other features, aspects, and advantages of the present invention will become better understood when the following detailed description is read with reference to the accompanying drawing, wherein.

DETAILED DESCRIPTION

Embodiments of the invention relate to a cryogenic system for a superconducting magnet. The cryogenic system comprises at least one closed-loop cooling path, and the closed-loop cooling path comprises at least one cooling tube thermally coupled to the superconducting magnet, a re-condenser fluidly coupled to the magnet cooling tube through tube sections and associated with a refrigerator, at least one liquid cryogen container fluidly coupled between the magnet cooling tube and the re-condenser, and at least one gas tank fluidly coupled to the magnet cooling tube through a connection tube. A cryogen flows in the closed-loop cooling path, which comprises a liquid cryogen flowing through at least a portion of the magnet cooling tube, and a gaseous cryogen vaporized from the liquid cryogen.

Figure 1:
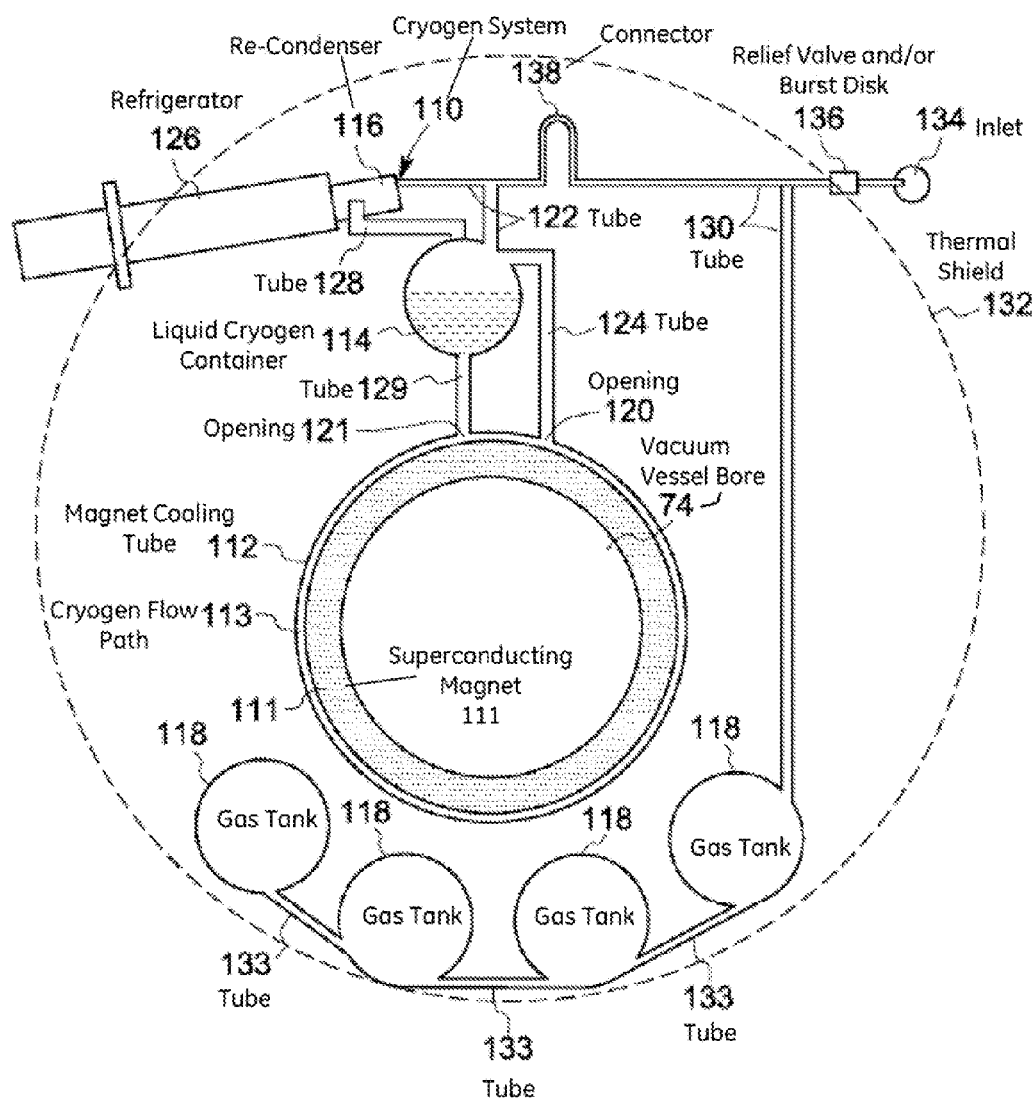
FIG. 1 illustrates a cryogenic system for a superconducting magnet according to one embodiment of the invention.

Referring to FIG. 1, an exemplary cryogenic system 110 for cooling a superconducting magnet 111 is illustrated, which is very exaggerated for purposes of illustration and is not drawn to scale. The illustrated cryogenic system 110 comprises a closed-loop cooling path. A cryogen flows in the closed-loop cooling path comprising both liquid and gaseous cryogen. In the illustrated embodiment, the closed-loop cooling path comprises a magnet cooling tube 112 thermally coupled with the superconducting magnet 111, at least one liquid cryogen container 114 storing the liquid cryogen during a normal cooling operation and transmitting the liquid cryogen to flow through at least a portion of the magnet cooling tube 112, a re-condenser 116 re-condensing the boil-off gas from the magnet cooling tube 112 back into liquid which fills back in the liquid cryogen container 114, and at least one gas tank 118 for storing the gaseous cryogen at a ride-through operation of the cryogenic system when the normal cooling operation breaks down.

In the illustrated embodiment, the magnet cooling tube 112 has a substantially circular shape and includes a cryogen flow passage 113 and a first and a second opening 120, 121 in the cryogen flow path 113. During the normal cooling operation, the cryogenic system 110 removes heat of the superconducting magnet 111 by the latent heat of vaporization by converting the liquid cryogen into the gaseous cryogen in the magnet cooling tube 112. Accordingly, the superconducting magnet 111 is maintained at its superconducting temperature, and is operated at its superconducting state. In certain embodiments, the cryogen flowing in the closed-loop cooling path may be nitrogen, neon, hydrogen, helium, or a combination of such gases or vapors or liquids, or any other suitable cryogen capable of withdrawing sufficient heat from the superconducting magnet 111.

In the illustrated embodiment, the re-condenser 116 is associated with a refrigerator 126, which is operable to cool the re-condenser 116 to a low enough temperature, such as about 2 Kelvin (K) to about 4 K for example, to convert the gaseous cryogen back into its liquid phase. The re-condenser 116 has a heat transfer surface area (not shown) contacting with the gaseous cryogen to convert the gaseous cryogen back into its liquid phase. In certain embodiments, the re-condenser 116 comprises copper or aluminum which has a good thermal conductivity.

In the illustrated embodiment, the re-condenser 116 is fluidly coupled to the first opening 120 of the magnet cooling tube 112 through a first tube section 122 between the re-condenser 116 and magnet cooling tube 112, and a second tube section 124 between the fluid cryogen container 114 and the magnet cooling tube 112. Accordingly, the gaseous cryogen from first opening 120 of the magnet cooling tube 112 flows through the second tube section 124 into the liquid cryogen container 114, and further flows to contact with the re-condenser 116 through the first tube section 122 to be converted into liquid cryogen by the re-condenser 116. In an alternative embodiment, the re-condenser 116 may directly coupled to the magnet cooling tube 112 through one tube section which bypasses the liquid cryogen container 114.

In the illustrated embodiment, the re-condenser 116 is fluidly coupled to the liquid cryogen container 114 through a third tube section 128 for transmitting the liquid cryogen into the liquid cryogen container 114. In the illustrated embodiment, the re-condenser 116 is located above the liquid cryogen container 114. Accordingly, the liquid cryogen flows into the liquid cryogen container 114 driven by gravity. In certain embodiments, the gaseous cryogen may also flow to the re-condenser 116 through the third tube section 128, and the liquid cryogen may also flow through the second tube section 124. Accordingly, the cryogen flowing through the magnet cooling tube 112 may be a mixture of the liquid cryogen and the gaseous cryogen.

In the illustrated embodiment, the liquid cryogen container 114 is positioned above the magnet cooling tube 112, and coupled to the second opening 121 of the magnet cooling tube 112 through a fourth tube section 129. Accordingly, the liquid cryogen flows from the liquid cryogen container 114 into the magnet cooling tube 112 through the second opening 121 by gravity. In certain embodiments, the liquid cryogen container 114 comprises stainless steel, aluminum or composite materials. In certain embodiments, cryogenic system 110 comprises more than one liquid cryogen container 114 receiving the liquid cryogen from the re-condenser 116, and transmitting the liquid cryogen to flow through the magnet cooling tube 112.

In certain embodiments, the magnet cooling tube 112 is arranged on the outer surface of the superconducting magnet 111 along a circumferential direction. In other embodiments, the magnet cooling tube 112 may be arranged on the outer surface of the superconducting magnet 111 along a substantially longitudinal direction of the superconducting magnet 111. In certain embodiments, more than one cooling tube 112 may be arranged on the outer surface of the superconducting magnet 111. In one embodiment, the magnet cooling tube 112 has an electric insulation layer contacting with magnet coils of the superconducting magnet 111 for providing a direct cooling of the magnet coils. In other embodiments, the magnet cooling tube 112 contacts with a supporting portion or a cooling element of the superconducting magnet 111. Accordingly, heat is transmitted from the magnet coils through the supporting portion or the cooling element to the magnet cooling tube 112, and is further removed by latent heat of vaporization from the conversion of the liquid cryogen into gaseous cryogen in the cooling magnet tube 112. In certain embodiments, the magnet cooling tube 112 comprises stainless steel, aluminum, copper or brass material.

In the illustrated embodiment, at least one gas tank 118 is fluidly coupled to the cryogen flow passage 113 of the magnet cooling tube 112 through a connection tube 130. In certain embodiments, the gas tank 118 comprises stainless steel, aluminum, brass, copper or composite material. In the illustrated embodiment, the system 110 comprises a plurality of gas tanks 118, and the plurality of gas tanks 118 are connected through connection tubes 133. The gas tanks 118 are coupled to the magnet cooling tube 112 through the connection tubes 130 for receiving the boil-off gaseous cryogen. In the illustrated embodiment, the connection tube 130 comprises an L shape with a top portion in a substantially horizontal direction, and a lower portion oriented in a substantially upper to lower direction. In the illustrated embodiment, the top portion of the connection tube 130 is coupled to the first tube section 112 between the re-condenser 116 and the magnet cooling tube 112. In an alternative embodiment, the gas tank 118 may be directed connected to the magnet cooling tube through one connection tube routed from the second tube section 124 which bypasses the liquid cryogen container 114. In other embodiments, the system 110 comprises a plurality of connection tubes each connecting the magnet cooling tube 112 with a corresponding gas tank 118. In the illustrated embodiment, the gas tanks 118 are arranged in a position lower than the magnet cooling tube 112. In other embodiments, the gas tanks 118 may be positioned above the magnet cooling tube 112.

In certain embodiments, the cryogenic system 110 further comprises a thermal shield 132 thermally isolating the magnet 111 from the ambient temperature. The thermal shield 132 may be made of thermally conductive materials such as copper and aluminum. In the illustrated embodiment, the gas tanks 118 are distributed along an inner surface of the thermal shield 132 and are thermally coupled with the thermal shield 132. In certain embodiments, the thermal shield 132 comprises a cold radiation shield for the superconducting magnet 111 at a temperature of about 40 K to about 80 K. Accordingly, gaseous cryogen in the gas tanks 118 can undergo a greater rise in temperature during the ride-through operation. In other embodiments, the gas tanks 118 may be placed on an outer surface of the thermal shield.

In certain embodiments, the cryogenic system 110 comprises a blocking mechanism in the connection tube 130 for preventing liquid cryogen from flowing into the gas tanks 118. In the illustrated embodiment, the blocking mechanism is an n-shaped connector 138 at a top portion of the connection tube 130 to prevent liquid from flowing to the gas tanks 118 during the normal cooling operation.

In the illustrated embodiment, the cryogenic system 110 further comprises an inlet 134 for introducing gaseous cryogen or liquid cryogen into the closed-loop cooling path during a start-up operation for cooling the superconducting magnet 111 from a higher temperature, such as a room temperature, to the superconducting temperature of the superconducting magnet 111 before the normal cooling operation starts. In certain embodiments, the inlet 134 is also used for refilling or supplementing cryogen into the closed-loop cooling path.

In certain embodiments, during the start-up operation, the gaseous cryogen is continuously pressed into the closed-loop cooling path from the inlet 134, and is converted into liquid cryogen by the re-condenser 116, and further flows through the magnet cooling tube 112 to remove heat from the superconducting magnet 111. In certain embodiments, all the gaseous cryogen is charged into the closed-loop cooling path at the start at a high pressure, and an external pump (not shown) can be used to drive the high-pressure gaseous cryogen into the closed-loop cooling path from the inlet 134. The pressure will come down to the operation pressure when the temperature of the superconducting magnet 111 reaches the superconducting temperature, such as 4 K, and the cryogenic system 110 starts its normal cooling operation.

In certain embodiments, when the cryogenic system 110 is in a ride-through operation, such as when the refrigerator 126 stops providing cooling of the re-condenser 116 or when the superconducting magnet 111 is undergoing an unexpected quench, the re-condenser 116 can not provide effective cooling operation to convert enough boil-off gaseous cryogen into liquid cryogen, and the normal cooling operation can not continue. Temperature in the closed-loop cooling path increases, and the boil-off gaseous cryogen is stored in the gas tanks 118.

In certain embodiments, a total volume ($V_t$) of the gas tanks 118 is designed to be enough to keep the gas pressure below the cryogen supercritical pressure when all liquid cryogen in the liquid cryogen container is converted into gas phase during the ride-through operation. Above the supercritical pressure, there is no liquid to gas phase change in the cryogen as it absorbs heat. The cryogen latent heat becomes zero and can no longer keep the superconducting coil at stable cryogenic temperatures. Accordingly, the supercritical pressure is dependent on the type of cryogen selected. It is desirable that, during the ride-through operation, all liquid cryogen has been changed into the gaseous cryogen before the pressure reaches the supercritical pressure, and thus the cryogen is fully utilized for cooling. For a given amount of cryogen in the closed-loop cooling system, the volume of the system can be determined by the thermal dynamic state, including pressure and temperature for example, of the cryogen at the point when all the liquid turns into gas.

In certain embodiments, the system remains closed when it warms up to the room temperature. The mechanical strength of system needs to be strong to withhold the gas pressure, which can be obtained according to the ideal gas law:

$$PV = nRT$$

wherein "P" is the supercritical pressure of the gas to be, "V" is the volume of the gas, i.e. volume of the closed-loop cooling path; "n" is the amount of substance of the gas and is usually measured in moles, "R" is the gas constant which is 8.314472 $JK^{-1}mol^{-1}$, and "T" is the absolute temperature of the system when it warms up to the room temperature.

In the illustrated embodiment, the system further comprises an exit for exiting of gas when pressure exceeds a threshold value. In the illustrated embodiment, the exit is the same as the inlet 134. In other embodiments, the exit is a different outlet arranged, for example, adjacent to the gas tanks 118. In certain embodiments, the cryogenic system 110 comprises a pressure relief valve and/or a burst disk 136 between the closed-loop cooling path and the exit for safety purposes. In certain embodiments, the cryogenic system 110 comprises a controller (not shown) operable to control a heater heat input and to regulate the pressure and temperature of the cryogenic system 110.

Figure 2:
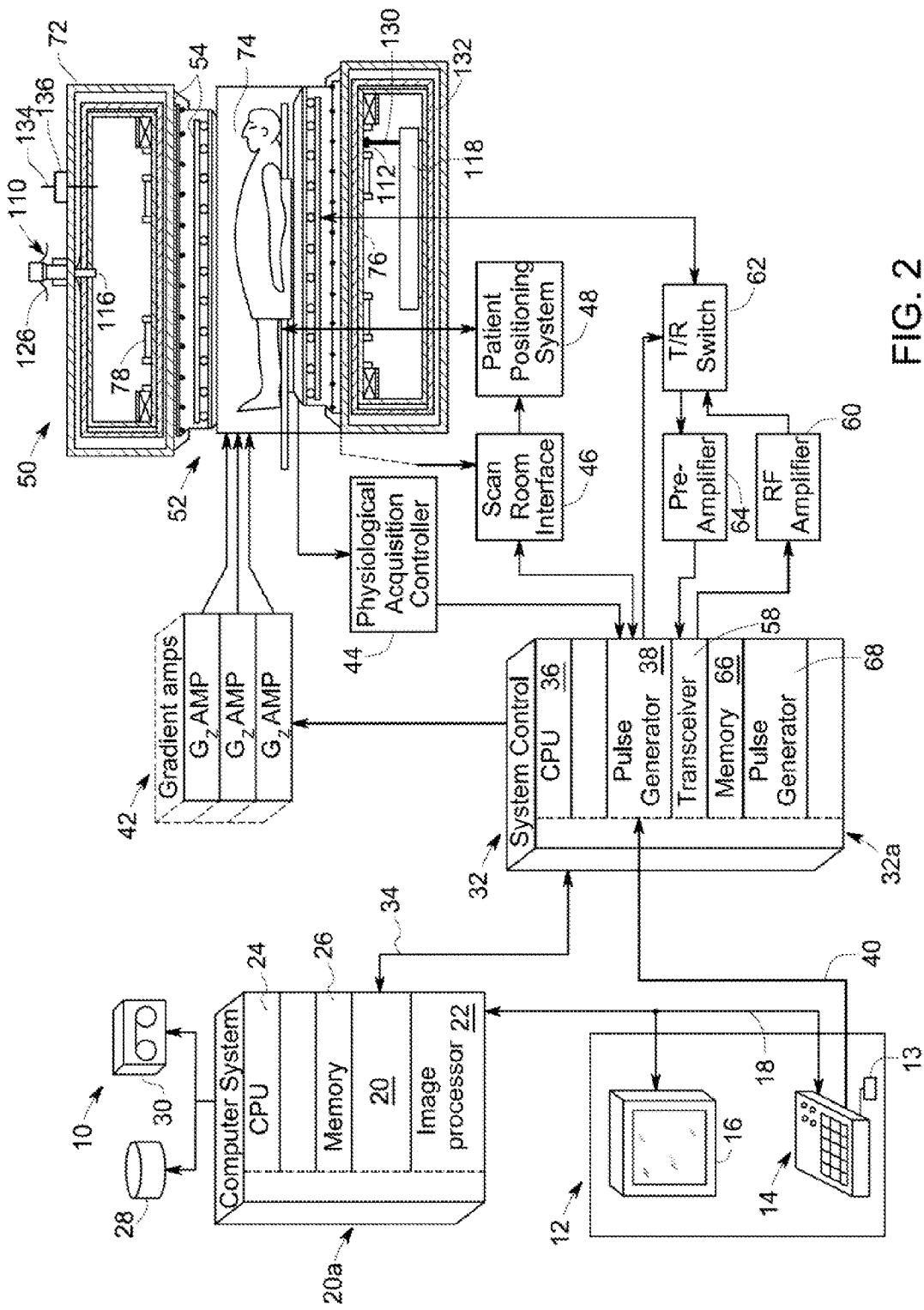
FIG. 2 illustrates a magnetic resonance imaging system using the cryogenic system according to one embodiment of the invention.

Referring to FIG. 2, the cryogenic system 110 is used in a magnetic resonance imaging (MRI) system 10 for medical diagnosis. In the illustrated embodiment, the MRI system 10 comprises an operator console 12 for an operator to the control operation of the system 10. The exemplary operator console 12 includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

In the illustrated embodiment, the system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. The pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. The gradient waveforms produced by the pulse generator module 38 are applied to the gradient amplifier system 42 having Gx, Gy, and Gz amplifiers.

The magnet assembly 50 includes a gradient coil assembly 52, a polarizing magnet 54 and a whole-body RF coil 56. Each gradient amplifier excites a corresponding physical gradient coil in the gradient coil assembly 52 to produce the magnetic field gradients used for spatially encoding acquired signals. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

In the illustrated embodiment, the magnet assembly 50 also includes a vacuum vessel 72 defining a bore 74. As will be appreciated by those skilled in the art, in an imaging application, a subject is placed in the bore 74 for imaging. Thus, the bore 74 provides access to the imaging volume for a subject.

The thermal shield 132 is disposed within the vacuum vessel 72. The superconducting magnet 111 is disposed within the thermal shield 132 by mechanical support structures which are not shown. One embodiment of the superconducting magnet 111 includes a cylindrical bobbin 76 and a plurality of superconducting magnet coils 78 wound on an outer surface of the cylindrical bobbin 76. In certain embodiments, the bobbin 76 may be made of electrically non-conductive material, such as plastic, and the like. The superconducting coils 78, which may be made of a coil of superconducting wires, such as of NbTi and $Nb_3Sn$ wires.

In the illustrated embodiment, the inlet 134 of the cryogenic system 110 extending through a top portion of the vacuum vessel 72 and the thermal shield 132 for filling cryogen into the cooling path. In one embodiment, the inlet 134 is also an outlet for releasing gaseous cryogen when pressure in the cooling path is too high. The refrigerator 126 of the cryogenic system is placed at the top of the vacuum vessel 72, and the re-condenser 116 extends into the thermal shield 132. The liquid cryogen container 114 and the tube sections in the cooling path are omitted from FIG. 2 for a simplified illustration. The plurality of gas tanks 118 in thermal contact with the inner surface of the thermal shield 132. The gas tanks 118 are fluidly coupled to one another through fourth tube sections 133 to the magnet cooling tube 112. The total volume of the gas tanks 118 is determined to be large enough to accommodate the boil-off gaseous cryogen such that, below or at the supercritical pressure, all liquid cryogen has vaporized into gaseous cryogen. Accordingly, the liquid cryogen is fully utilized for cooling the superconducting magnet 111 during the ride-through operation, and the cryogenic system can provide a longer ride-through operation.

In other embodiments, the cryogenic system can be used for superconducting magnets in other applications such as in rotors for electric generators and motors, and magnetic levitation devices for train transportation for example.

The embodiments described herein are examples of compositions, structures, systems, and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. A cryogenic system configured for a superconducting magnet comprising a closed-loop cooling path,
    the closed-loop cooling path comprising:
        a magnet cooling tube thermally coupled to the superconducting magnet,
    the magnet cooling tube comprising:
        a cryogen flow passage;
        a re-condenser fluidly coupled to the magnet cooling tube through tube sections;
        a liquid cryogen container fluidly coupled between the magnet cooling tube and the re-condenser; and
        at least one gas tank fluidly coupled to the magnet cooling tube through a connection tube;
        wherein the gas tank is configured to receive the boil-off gaseous cryogen, such that the boil-off gaseous cryogen does not escape to the atmosphere, is returned and utilized again, for ongoing cooling, within the closed-loop cooling path of the cryogenic system.

2. The cryogenic system of claim 1, wherein the liquid cryogen container is arranged below the re-condenser.

3. The cryogenic system of claim 1, wherein the liquid cryogen container is arranged above the magnet cooling tube.

4. The cryogenic system of claim 1, wherein the magnet cooling tube is arranged on an outer surface of the superconducting magnet.

5. The cryogenic system of claim 1, wherein the magnet cooling tube comprises stainless steel, brass, copper, or aluminum materials.

6. The cryogenic system of claim 1, wherein the closed-loop cooling path comprises a plurality of interconnected gas tanks.

7. The cryogenic system of claim 6, wherein the plurality of gas tanks are fluidly coupled to one another.

8. The cryogenic system of claim 1, wherein the at least one gas tank comprises; stainless steel, brass, copper, aluminum or composite materials.

9. The cryogenic system of claim 1 further comprising a thermal shield surrounding the superconducting magnet, and
    wherein the at least one gas tank is thermally coupled to the thermal shield.

10. The cryogenic system of claim 9, wherein the thermal shield comprises a cold radiation shield for the superconducting magnet at a temperature of 40 Kelvin to 80 Kelvin.

11. The system of claim 1, wherein the closed-loop cooling path comprises an exit in order to release the gaseous cryogen when a pressure of the gaseous cryogen exceeds a determined value.

12. A magnetic resonance imaging system comprising:
a superconducting magnet defining a central bore;
a thermal shield enclosing the superconducting magnet; and
a closed-loop cooling path within the thermal shield comprising:
a magnet cooling tube thermally coupled to the superconducting magnet,
the magnet cooling tube comprising a cryogen flow passage;
a re-condenser fluidly coupled to the magnet cooling tube through tube sections and being associated with a refrigerator;
a liquid cryogen container fluidly coupled between the magnet cooling tube and the re-condenser; and
at least one gas tank in thermal contact with the thermal shield, and fluidly coupled to the magnet cooling tube through a connection tube;
wherein the gas tank is configured to receive the boil-off gaseous cryogen, such that the boil-off gaseous cryogen does not escape to the atmosphere, is returned and utilized again, for ongoing cooling, within the closed-loop cooling path of the cryogenic system.

13. The magnetic resonance imaging system of claim 12 further comprising a vacuum vessel enclosing the thermal shield.

14. The magnetic resonance imaging system of claim 12 further comprising: a magnet assembly, a gradient coil assembly, a polarizing magnet, and a whole-body RF coil adjacent to an inner surface of the central bore.

15. The magnetic resonance imaging system of claim 12, wherein the gas tank is arranged along the inner or outer surfaces of the thermal shield.

16. A cryogenic cooling method that is used with a superconducting magnet, comprising:
thermally contacting a magnet cooling tube to the superconducting magnet;
flowing a liquid cryogen through at least a portion of the magnet cooling tube;
removing heat of the superconducting magnet by a vaporization of converting the liquid cryogen into a boil-off gaseous cryogen;
contacting the boil-off gaseous cryogen with a re-condenser for converting some of the boil-off gaseous cryogen back into liquid cryogen, and filling back the liquid cryogen into the magnet cooling tube; and
storing some of the boil-off gaseous cryogen in at least one gas tank which is fluidly coupled to the magnet cooling tube through a connection tube, such that the boil-off gaseous cryogen does not escape to the atmosphere, is fully returned, and utilized, for ongoing cooling use, within the cryogenic system.

17. The method of claim 16 further comprising: determining a volume of the boil-off gaseous cryogen wherein all boil-off gaseous cryogen is stored in the cryogenic system, and wherein when all liquid cryogen is converted into gaseous cryogen and the gas pressure in the system is at or below a supercritical pressure of the gaseous cryogen.

* * * * *

UNITED STATES PATENT AND TRADEMARK OFFICE
CERTIFICATE OF CORRECTION

| | | |
|---|---|---|
| PATENT NO. | : 8,643,367 B2 | Page 1 of 1 |
| APPLICATION NO. | : 12/912934 | |
| DATED | : February 4, 2014 | |
| INVENTOR(S) | : Huang et al. | |

It is certified that error appears in the above-identified patent and that said Letters Patent is hereby corrected as shown below:

In the Claims

In Column 8, Line 59, in Claim 8, delete "comprises;" and insert -- comprises: --, therefor.

Signed and Sealed this
Twentieth Day of May, 2014

Michelle K. Lee
*Deputy Director of the United States Patent and Trademark Office*